(12) United States Patent
Lee et al.

(10) Patent No.: US 7,230,307 B2
(45) Date of Patent: Jun. 12, 2007

(54) VERTICAL OFFSET STRUCTURE AND METHOD FOR FABRICATING THE SAME

(75) Inventors: Sang-woo Lee, Seoul (KR); Byeung-leul Lee, Yongin-si (KR); Jong-pal Kim, Seoul (KR); Joon-hyock Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 11/183,863

(22) Filed: Jul. 19, 2005

(65) Prior Publication Data
US 2006/0023995 A1 Feb. 2, 2006

(30) Foreign Application Priority Data
Jul. 19, 2004 (KR) ............... 10-2004-0056009

(51) Int. Cl.
H01L 27/14 (2006.01)
H01L 29/82 (2006.01)
H01L 29/84 (2006.01)

(52) U.S. Cl. ............... 257/414; 257/433; 257/E29.324; 438/459; 385/18

(58) Field of Classification Search ............... None
See application file for complete search history.

(56) References Cited

U.S. PATENT DOCUMENTS

| 6,391,673 | B1* | 5/2002 | Ha et al. ............... 438/51 |
| 6,694,504 | B2* | 2/2004 | Cho et al. ............... 716/19 |
| 6,739,189 | B2* | 5/2004 | Lee et al. ............... 73/488 |
| 6,841,839 | B2* | 1/2005 | Sridhar et al. ............... 257/415 |
| 6,939,473 | B2* | 9/2005 | Nasiri et al. ............... 216/2 |
| 7,034,370 | B2* | 4/2006 | Kuo ............... 257/414 |
| 2002/0158293 | A1* | 10/2002 | Lee et al. ............... 257/414 |
| 2002/0164833 | A1* | 11/2002 | Cho et al. ............... 438/50 |
| 2005/0170656 | A1* | 8/2005 | Nasiri et al. ............... 438/700 |
| 2005/0266598 | A1* | 12/2005 | Kim et al. ............... 438/50 |

* cited by examiner

Primary Examiner—Evan Pert
Assistant Examiner—Benjamin P. Sandvik
(74) Attorney, Agent, or Firm—Sughrue Mion, PLLC

(57) ABSTRACT

A vertical offset structure and a method for fabricating the same. The vertical offset structure includes a substrate; a fixed electrode fixing portion formed on the substrate; a fixed electrode moving portion formed at a position away from an upper portion of the substrate by a predetermined distance; a spring portion for connecting the fixed electrode fixing portion and the fixed electrode moving portion to each other so that the fixed electrode moving portion moves into a direction substantially perpendicular to a plate surface of the substrate; a movable electrode located away from the upper portion of the substrate by a predetermined distance to have a predetermined interval horizontal to the fixed electrode moving portion; and a cap wafer bonded to a predetermined area of one of the fixed electrode moving portion and the movable electrode.

15 Claims, 7 Drawing Sheets

VERTICAL OFFSET STRUCTURE AND METHOD FOR FABRICATING THE SAME

CROSS-REFERENCE TO RELATED APPLICATIONS

This application claims the benefit of Korean Patent Application No. 2004-56009, filed on Jul. 19, 2004, in the Korean Intellectual Property Office the entire disclosure of which is incorporated herein by reference.

BACKGROUND OF THE INVENTION

1. Field of the Invention

The present invention relates to a vertical offset structure and a method for fabricating the same, and more particularly, to a vertical offset structure used for a vertical operation type capacitance electrode, and a method for fabricating the same 2. Description of the Related Art Vertical offset structures can be manufactured using a micro electro mechanical system (MEMS). MEMS is a technology that embodies mechanical and electrical components using a semiconductor process. Examples of a system manufactured by MEMS technology include: an accelerometer for sensing acceleration of a moving object, an angular velocity meter for sensing a rotating velocity of a rotating object, and an optical switch for controlling an optical path.

Performance of a vertical offset structure using MEMS technology is determined according to whether or not an upper surface and a lower surface of the vertical offset structure form a perfect vertical offset. The performance of a vertical offset structure is further determined by the narrowness of a horizontal interval between vertical offset structures, in order to improve vertical driving and sensing performances.

FIGS. 1A to 1D are views showing a vertical offset structure using MEMS technology.

In detail, FIG. 1A is a view showing a vertical offset structure manufactured using a(bilateral arrangement of a conventional wafer. The vertical offset structure using a bilateral arrangement of a wafer is manufactured by simultaneously processing respective front and rear surfaces of the wafers after arranging two wafers in a line. In the vertical offset structure manufactured by such a method, it is difficult to obtain a horizontal interval of less than 5 µm between a movable electrode and a fixed electrode due to a bilateral arrangement error in wafers. A fixed electrode and a movable electrode manufactured by such a method cannot function as a comb electrode having overlap.

FIG. 1B is a view showing a vertical offset structure manufactured using a conventional dual mask and undercut etching characteristics.

As described above, a method as shown in FIG. 1A manufactures the vertical offset structure using a bilateral arrangement of wafers. In contrast, referring to FIG. 1B, a vertical offset structure is manufactured at one wafer using a dual mask and undercut etching. Therefore, unlike the vertical offset structure manufactured using a dual arrangement of wafers, the method of FIG. 1B may form a small horizontal interval between a movable electrode and a fixed electrode. However, as shown in FIG. 1B, when the vertical offset structure is manufactured using the dual mask and the undercut etching characteristics, the manufacturing process is significantly complicated. Further, since an electrode is manufactured using a dual mask, it is difficult to obtain a horizontal interval of less than 2 µm between a movable electrode and a fixed electrode due to an arrangement error.

FIG. 1C is a view showing a vertical offset structure manufactured using a conventional reactive ion etching (RIE) lag and undercut etching characteristics. More specifically, FIG. 1C is a perspective view showing a fixed electrode and a movable electrode of a vertical offset structure manufactured using RIE lag and undercut etching characteristics which occur due to an etching ratio difference according to a pattern size opened while a deep thin film is being etched by RIE, and a cross-sectional view thereof taken along line A—A'. Unlike the vertical offset structure of FIG. 1B, the vertical offset structure of FIG. 1C is manufactured using one mask. Accordingly, since it is possible to form a small horizontal interval between a fixed electrode and a movable electrode, a manufacturing process is relatively simple. However, as shown in an area B, since a vertical offset is formed at only a lower portion of the fixed electrode and not at an upper portion of the fixed electrode, a perfect vertical comb electrode and a vertical offset structure having the same cannot be manufactured. Therefore, when the vertical offset structure is used for a capacitance electrode, the sensitivity thereof is reduced.

FIG. 1D is a plan view showing an example of a conventional vertical offset structure.

With reference to FIG. 1D, the conventional vertical offset structure includes a movable electrode and a fixed electrode. The movable electrode is vertically moved, but the fixed electrode is not moved. The vertical offset between the movable electrode and the fixed electrode, as described by reference to FIGS. 1A to 1C, is formed during a formation of the vertical offset structure. As a result, a procedure for manufacturing the vertical offset structure becomes complicated.

SUMMARY OF THE INVENTION

An aspect of the present invention addresses at least the above problems and/or disadvantages and provides at least the advantages described below. Accordingly, an aspect of the present invention is to provide a vertical offset structure having a high vertical offset and a simple manufacturing process and a method of fabricating the same.

In order to achieve the above-described aspects of the present invention, there is provided a vertical offset structure comprising a substrate; a fixed electrode fixing portion formed on the substrate; a fixed electrode moving portion formed at a position away from an upper portion of the substrate by a predetermined distance; a spring portion for connecting the fixed electrode fixing portion and the fixed electrode moving portion to each other so that the fixed electrode moving portion moves into a direction perpendicular to a plate surface of the substrate; a movable electrode located away from the upper portion of the substrate to have a predetermined interval horizontal to the fixed electrode moving portion; and a cap wafer bonded to a predetermined area of one of the fixed electrode moving portion and the movable electrode, making each of the fixed electrode moving portion and the movable electrode have a vertical offset so that one of the fixed electrode moving portion and the movable electrode moves into a direction perpendicular to the plate surface of the substrate.

In an exemplary embodiment, the spring portion may operate to allow the fixed electrode moving portion to be moved in only the direction perpendicular to the plate surface of the substrate.

In another exemplary embodiment, the cap wafer may perform an anodic bonding to a predetermined area of one of the fixed electrode moving portion and the movable electrode, whereby one of the fixed electrode moving portion and the movable electrode moves from the cap wafer to the substrate to form a vertical offset.

In another exemplary embodiment, the cap wafer may have a projection portion at a bonding area bonded to a predetermined area of one of the fixed electrode moving portion and the movable electrode so that one of the fixed electrode moving portion and the movable electrode moves from the substrate to the cap wafer.

The projection portion may be formed by etching areas other than the bonded area of the cap wafer or formed by depositing materials at the cap wafer and etching the deposited material at areas other than the bonded area of the cap wafer.

Consistent with another aspect of the present invention, there is provided a method for manufacturing a vertical offset structure, the method comprises: forming a fixed electrode fixing portion on a substrate; forming a fixed electrode moving portion at a position away from an upper portion of the substrate by a predetermined distance; forming a spring portion for connecting the fixed electrode fixing portion and the fixed electrode moving portion to each other so that the fixed electrode moving portion moves in a direction perpendicular to a plate surface of the substrate; forming a movable electrode located away from the upper portion of the substrate to have a predetermined interval horizontal to the fixed electrode moving portion; and bonding a cap wafer to a predetermined area of one of the fixed electrode moving portion and the movable electrode, and making each of the fixed electrode moving portion and the movable electrode have a vertical offset so that one of the fixed electrode moving portion and the movable electrode moves in a direction perpendicular to the plate surface of the substrate.

By using the above vertical offset structure, a vertical operation type capacitance electrode, an accelerometer, an angular velocity meter, or a mirror may be manufactured.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1A:
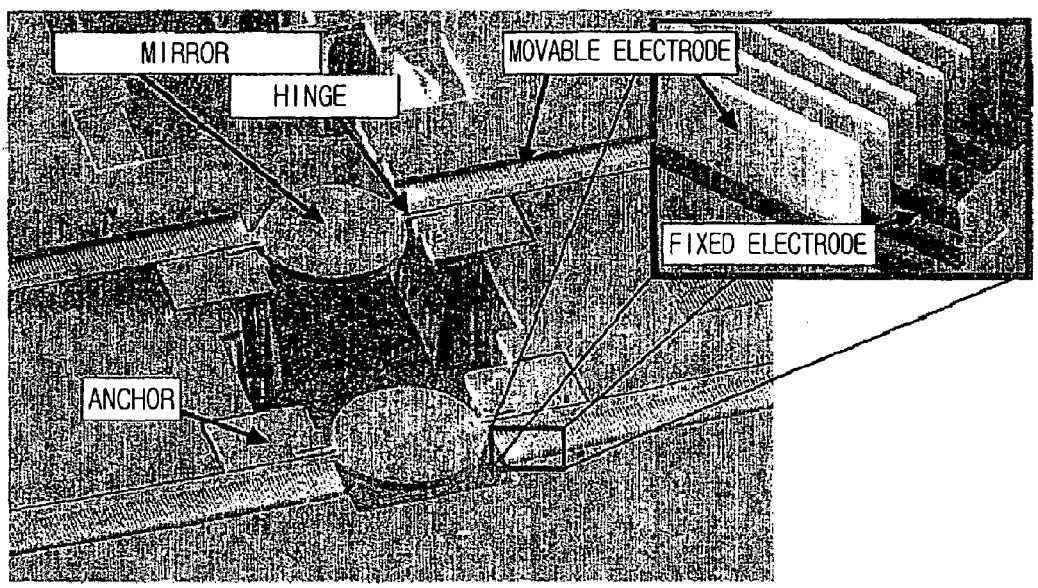
FIGS. 1A to 1D are views showing a vertical offset structure using a conventional micro electro mechanical system (MEMS) technology.
Figure 1B:
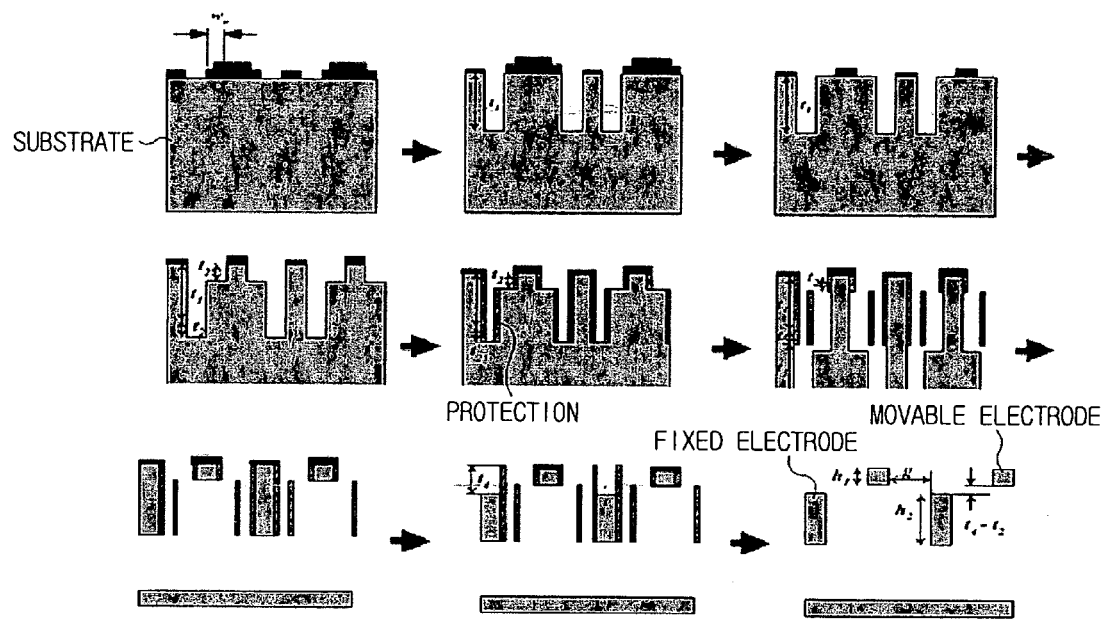
Figure 1C:
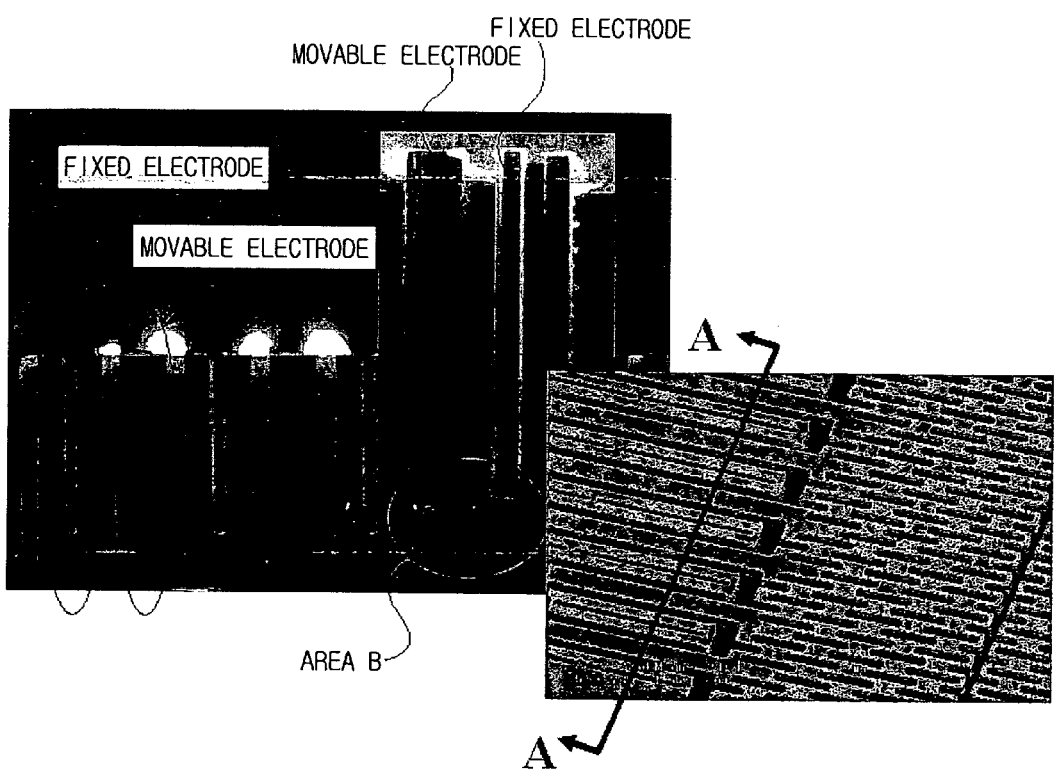
Figure 1D:
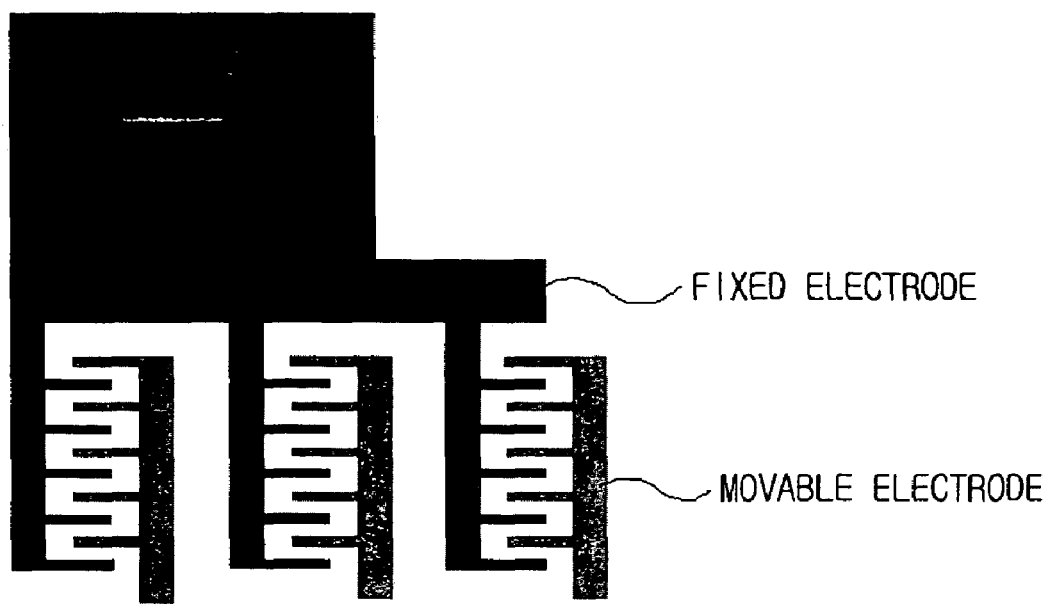

An exemplary embodiment of the present invention will be now described by reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 2A:
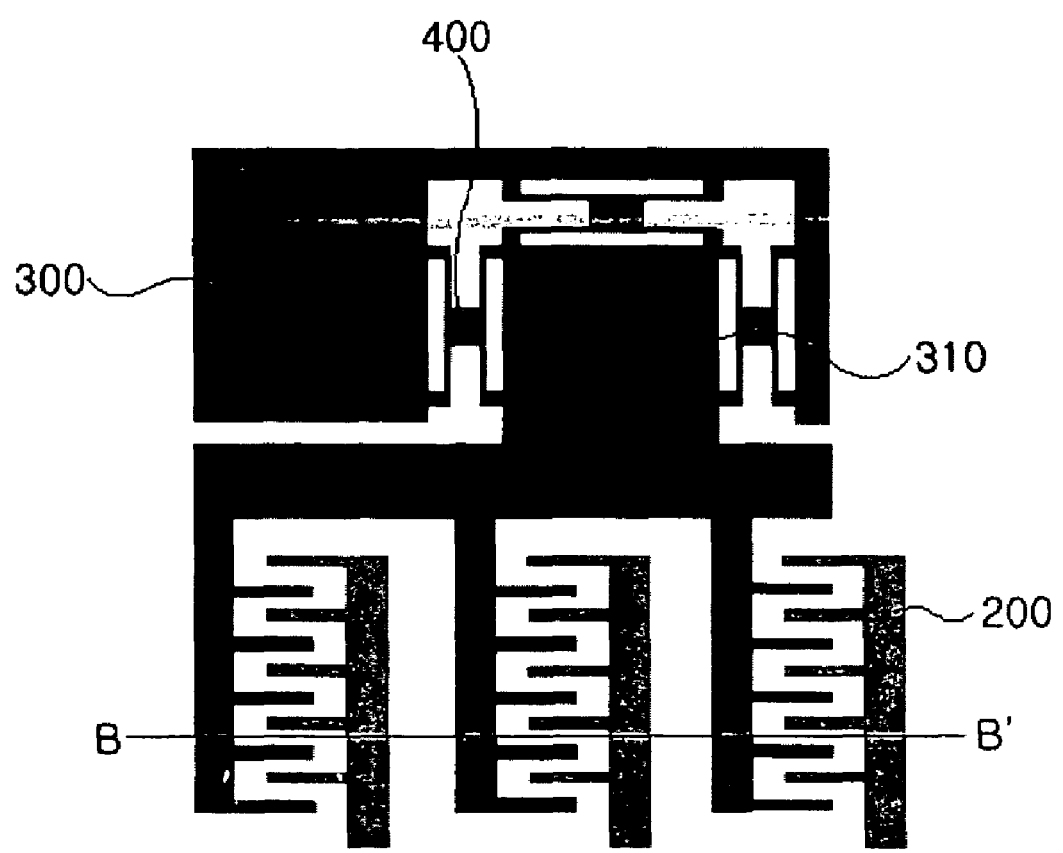
FIGS. 2A and 2B are a plan view and a cross-sectional view, respectively, of a vertical offset structure consistent with an exemplary embodiment of the present invention.
Figure 2B:
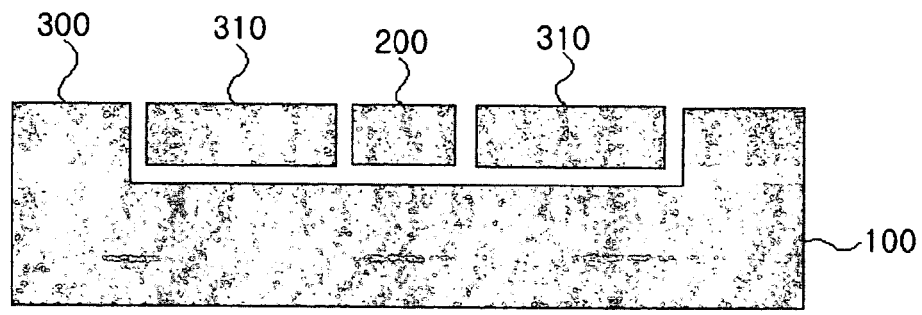

FIGS. 2A and 2B are a plan view and a cross-sectional view, respectively, of the vertical offset structure consistent with an exemplary embodiment of the present invention. FIG. 2B is a cross-sectional view of the vertical offset structure in FIG. 2A taken along line B—B'.

Referring to FIGS. 2A and 2B, the vertical offset structure consistent with an exemplary embodiment of the present invention includes a substrate 100, a movable electrode 200, a fixed electrode fixing portion 300, a fixed electrode moving portion 310, and a spring portion 400.

The movable electrode 200 is formed away from an upper portion of the substrate 100 by a predetermined distance from the substrate, and operates in a direction perpendicular to a plate surface of the substrate 100.

A fixed electrode is composed of the fixed electrode fixing portion 300 and the fixed electrode moving portion 310. The fixed electrode fixing portion 300 is formed on the substrate 100, but is not moved in a direction perpendicular to a plate surface of the substrate 100. Furthermore, the fixed electrode moving portion 310 is formed to have the same height as that of the movable electrode 200 at an upper portion of the substrate 100 without a vertical offset. When the fixed electrode moving portion 310 is bonded to a cap wafer, the fixed electrode moving portion 310 moves in a direction perpendicular to a plate surface of the substrate 100 to form a vertical offset. In order to achieve this, the fixed electrode moving portion 310 is formed away from the substrate 100 by a predetermined distance. Accordingly, upon manufacturing the movable electrode 200 and the fixed electrode, it forms a vertical offset structure in a simpler manner in comparison with a case where the fixed electrode and the movable electrode 200 have a vertical offset.

Furthermore, the spring portion 400 connects the fixed electrode fixing portion 300 and the fixed electrode moving portion 310 to each other, so that the fixed electrode moving portion 310 moves in a direction perpendicular to a plate surface of the substrate 100. At this time, since the spring portion 400 is manufactured to be easily moved in only a direction perpendicular to a plate surface of the substrate 100 but has a strong rigidity against other directions thereof, the fixed electrode moving portion 310 moves in only a direction perpendicular to the plate surface of the substrate 100.

Figure 3:
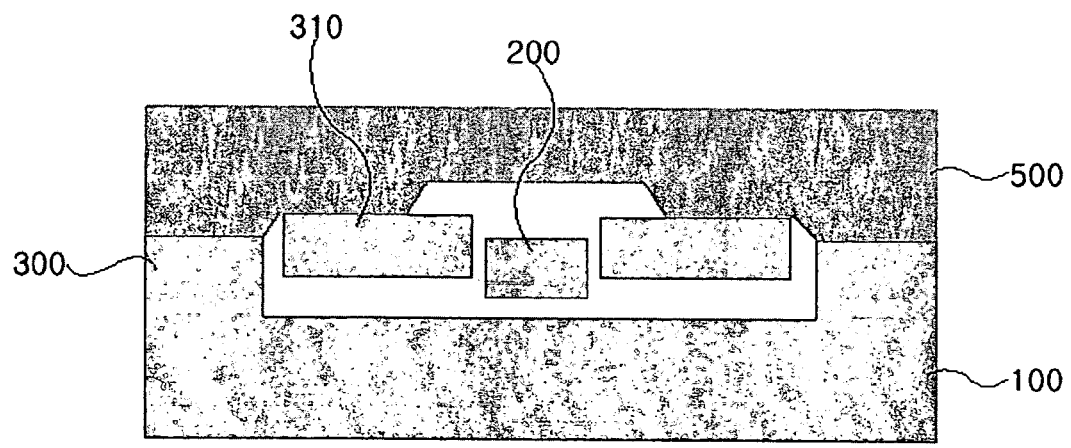
FIG. 3 is a cross-sectional view of the vertical offset structure consistent with an exemplary embodiment of the present invention to which a cap wafer is bonded.

FIG. 3 is a cross-sectional view of the vertical offset structure consistent with an exemplary embodiment of the present invention as shown in FIG. 2B to which a cap wafer is bonded.

With reference to FIG. 3, by using electrostatic force which occurs when a capacitance electrode is bonded to the cap wafer 500, the fixed electrode moving portion 310 moves in a direction of the cap wafer 500 from the substrate 100, thereby forming a vertical offset of the fixed electrode moving portion 310 and the movable electrode 200. That is, when a fixed electrode and a movable electrode 200 without a vertical offset as shown in FIG. 2B are bonded to the cap wafer 500, a fixed electrode moving portion 310 and a fixed electrode fixing portion 300, by moving the fixed electrode moving portion 310 from the substrate 100 to the cap wafer 500, from a vertical offset between the movable electrode 200 and the fixed electrode moving portion 310.

Accordingly, in the present exemplary embodiment as shown in FIG. 3, the cap wafer 500 has a space at an area to which the fixed electrode moving portion 310 is bonded. The fixed electrode moving portion 310 may move in a direction toward the cap wafer 500 from the substrate 100 through the space. Further, the space prevents the movable electrode 200 from being bonded to the cap wafer 500. Namely, before the cap wafer 500 is bonded to the fixed electrode moving portion 310, after the cap wafer 500 is positioned away from an upper portion of the fixed electrode moving portion 310 by a predetermined distance, the fixed electrode moving portion 310 is bonded to the cap wafer 500. Thereafter, the fixed electrode moving portion 310 is moved from the substrate 100 to the cap wafer 500.

On the other hand, so as to form a vertical offset between a fixed electrode and the movable electrode 200, as described above, the fixed electrode moving portion 310 is not moved from the substrate 100 to the cap wafer 500. Rather, the cap wafer 500 is bonded to the movable electrode 200, so that the movable electrode 200 is moved from the substrate 100 to the cap wafer 500. That is, by using an electrostatic force which occurs when the movable electrode 200 is bonded to the cap wafer 500 by anodic bonding, the movable electrode 200 is moved in a direction in which the cap wafer 500 is positioned, causing the formation of a vertical offset between the movable electrode 200 and the fixed electrode moving portion 310.

Here, the cap wafer 500 has a space formed at a bonding area of the movable electrode 200. The movable electrode 200 is moved from the substrate 100 to the cap wafer 500 through the space. The fixed electrode moving portion 310 forms a vertical offset so that cap wafer 500 is not bonded to the movable electrode 200. That is, before the cap wafer 500 is bonded to the movable electrode 200, the cap wafer 500 is positioned away from an upper portion of the movable electrode 200 by a predetermined distance. Next, the cap wafer 500 is bonded to the movable electrode 200 and the movable electrode 200 is moved from the substrate 100 to the cap wafer 500.

Figure 4A:
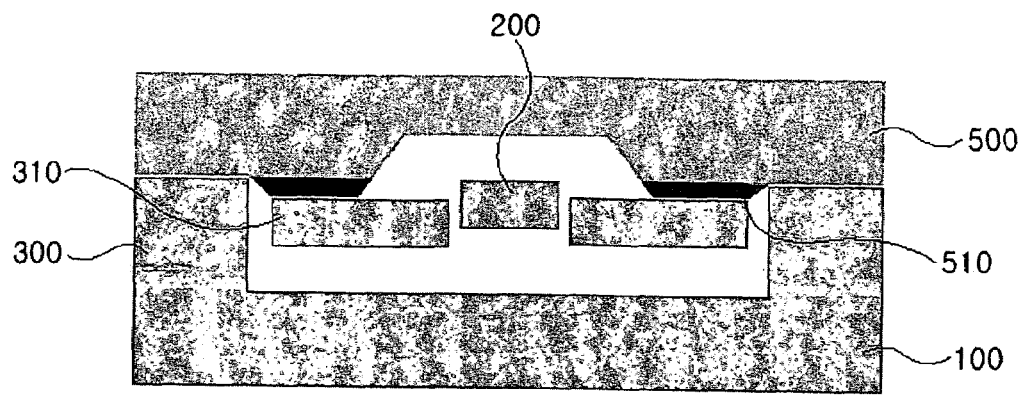
FIGS. 4A and 4B are cross-sectional views of the vertical offset structure consistent with another exemplary embodiment of the present invention to which a cap wafer is bonded.
Figure 4B:
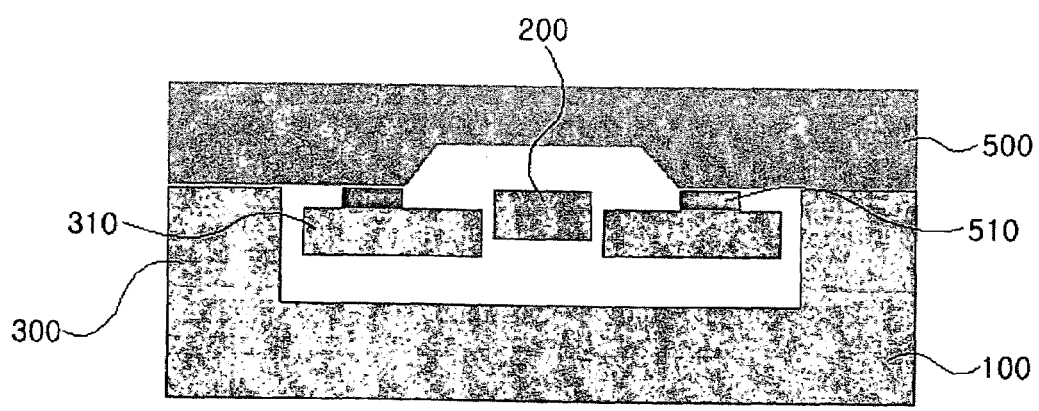

FIGS. 4A and 4B are cross-sectional views of the vertical offset structure of FIG. 2B consistent with another exemplary embodiment of the present invention to which a cap wafer 500 having a projection portion 510 is bonded.

Referring to FIGS. 4A and 4B, the projection portion 510 is formed at the cap wafer 500. Thus, when the cap wafer 500 is bonded to a vertical offset structure shown in FIG. 2B, the fixed electrode moving portion 310 is moved from the cap wafer 500 to the substrate 100 through the projection portion 510, thereby forming a vertical offset between the movable electrode 200 and the fixed electrode moving portion 310. At this time, the projection portion 510 is formed at a bonding area of the fixed electrode moving portion 310 in an area of the cap wafer 500, so that the fixed electrode moving portion 310 is moved from the cap wafer 500 to the substrate 100 through the projection portion 510. Unlike the case of FIG. 3, in the cases of FIGS. 4A and 4B, the cap wafer 500 is bonded to a vertical offset structure, and the fixed electrode moving portion 310 is not moved from the substrate 100 to the cap wafer 500. Rather, the fixed electrode moving portion 310 is moved from the cap wafer 500 to the substrate 100 to thereby form a vertical offset.

On the other hand, in the same manner as the case of FIG. 3, in the cases of FIGS. 4A and 4B, the fixed electrode moving portion 310 is not moved in a direction perpendicular to a plate surface of the substrate 100. The movable electrode 200 may be moved in a direction perpendicular to the plate surface of the substrate 100 that is determined according to a position in which the projection portion 510 is formed at the cap wafer 500. That is, the projection portion 510 is formed at a bonding area of the movable electrode 200 in an area of the cap wafer 500. Thus, when the cap wafer 500 is bonded to a predetermined area of the movable electrode 200, the movable electrode 200 is moved from the cap wafer 500 to the substrate 100 through the projection portion 510 that results in the formation of the vertical offset.

At this time, where the cap wafer 500 is bonded to a vertical offset structure, unlike the embodiment of FIG. 3 using an electrostatic force, the vertical offset is formed using the projection portion 510. Accordingly, in addition to anodic bonding, by Silicon Direct Bonding (SDB), Eutectic bonding, or Epoxy bonding, the cap wafer 500 may be bonded to the vertical offset structure.

Furthermore, as shown in FIG. 4A, the projection portion 510 of the cap wafer 500 is formed in such a way that the fixed electrode moving portion 310 or areas other than a bonded area of the movable electrode 200 among the cap wafer 500 areas is etched, and the cap wafer 500 of the bonded area is projected. In contrast to this, the projection portion 510 of the cap wafer 500 shown in FIG. 4B is formed by depositing materials on the cap wafer 500, and etching and patterning the materials deposited at areas other than a bonded area of the fixed electrode moving portion 310 or the movable electrode 200.

Thereafter, in a method for fabricating a vertical offset structure consistent with an exemplary embodiment of the present invention, the fixed electrode fixing portion 300 is formed on the substrate 100. Next, the fixed electrode moving portion 310 is formed away from an upper portion of the substrate 100 by a predetermined distance. The fixed electrode moving portion 310 is formed away from the substrate 100 by a predetermined distance. Unlike the fixed electrode fixing portion 300, the reason for doing so is to move the fixed electrode moving portion 310 in a direction perpendicular to a plate direction of the substrate 100. The spring portion 400 connects the fixed electrode fixing portion 300 to the fixed electrode moving portion 310. The spring portion 400 causes the fixed electrode moving portion 310 to be moved in only a direction perpendicular to a plate surface of the substrate 100. Thereafter, a movable electrode is formed away from an upper portion of the substrate 100 to have a predetermined interval horizontal to the fixed electrode moving portion 310.

A cap wafer 500 is formed to cover the vertical offset structure. The cap wafer 500 shown in FIG. 3 is bonded to the fixed electrode fixing portion 300, and bonded to any one of the fixed electrode moving portion 310 and the movable electrode 200. For example, a case where the cap wafer 500 is bonded to the fixed electrode moving portion 310, and a case where the cap wafer 500 is not bonded to the movable electrode 200 will now be described. Among an area of the cap wafer 500, areas to be positioned above the movable electrode 200 are etched deeper in comparison with other areas. That is, the fixed electrode moving portion 310 is etched deeper than the area of the cap wafer 500 to which the fixed electrode moving portion 310 is bonded so that the cap wafer 500 is bonded to the fixed electrode fixing portion 300 and the fixed electrode moving portion 310, but is not bonded to the movable electrode 200.

Furthermore, the cap wafer 500 of FIG. 4A and FIG. 4B is formed to have a projection portion 510 unlike the cap wafer of FIG. 3. First, in the area of the cap wafer 500 shown in FIG. 4A, areas other than areas to which the fixed electrode moving portion 310 or the movable electrode 200 will be bonded are etched. Accordingly, an area of the cap wafer 500 bonded to the movable electrode 200 or the fixing electrode moving portion 310 has a projected area in comparison with other areas as a projection portion 510.

On the contrary, materials are deposited on the cap wafer 500 shown in FIG. 4B. Next, by etching and patterning materials deposited on areas other than a bonded area of the fixed electrode moving portion 310 or the movable electrode 200, the projection portion 510 is formed, thereby forming the cap wafer 500 shown in FIG. 4B.

Such a vertical offset structure is used in an accelerometer for sensing acceleration of a moving object, an angular velocity meter for sensing a rotating velocity of a rotating object, and an optical switch for controlling an optical path.

As described above, consistent with an exemplary embodiment of the present invention, a fixed electrode is vertically moved using a spring portion. Thus, when a cap wafer is bonded to a vertical offset structure, the fixed electrode is vertically moved, thereby manufacturing a vertical operation type capacitance electrode having a great vertical offset.

Conventionally, when the fixed electrode and the movable electrode are manufactured, the vertical offset is formed. However, consistent with an exemplary embodiment of the present invention, upon bonding the cap wafer covering the vertical offset structure, since a vertical offset is formed by moving a predetermined area of a fixed electrode or a movable electrode, a process of manufacturing the vertical offset structure is relatively simple.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A vertical offset structure, comprising:
   a substrate;
   a fixed electrode fixing portion formed on the substrate;
   a fixed electrode moving portion formed at a position away from an upper portion of the substrate by a predetermined distance;
   a spring portion operable to connect the fixed electrode fixing portion and the fixed electrode moving portion to each other so that the fixed electrode moving portion moves in a direction substantially perpendicular to a plate surface of the substrate;
   a movable electrode located away from the upper portion of the substrate by a predetermined distance to have a predetermined interval horizontal to the fixed electrode moving portion; and
   a cap wafer bonded to a predetermined area of one of the fixed electrode moving portion and the movable electrode by making each of the fixed electrode moving portion and the movable electrode have a vertical offset so that one of the fixed electrode moving portion and the movable electrode moves in a direction substantially perpendicular to the plate surface of the substrate.

2. The vertical offset structure as claimed in claim 1, wherein the spring portion allows the fixed electrode moving portion to be moved in only the direction substantially perpendicular to the plate surface of the substrate.

3. The vertical offset structure as claimed in claim 1, wherein the cap wafer performs an anodic bonding to a predetermined area of one of the fixed electrode moving portion and the movable electrode, wherein one of the fixed electrode moving portion and the movable electrode moves from the substrate to the cap wafer to form a vertical offset.

4. The vertical offset structure as claimed in claim 1, wherein the cap wafer comprises a projection portion at a bonding area bonded to a predetermined area of one of the fixed electrode moving portion and the movable electrode so that one of the fixed electrode moving portion and the movable electrode moves from the cap wafer to the substrate.

5. The vertical offset structure as claimed in claim 4, wherein the projection portion is formed by etching areas other than the bonded area of the cap wafer.

6. The vertical offset structure as claimed in claim 4, wherein the projection portion is formed by depositing materials at the cap wafer and etching the deposited material at areas other than the bonded area of the cap wafer.

7. A vertical operation type capacitance electrode manufactured comprising a vertical offset structure comprising:
   a substrate;
   a fixed electrode fixing portion formed on the substrate;
   a fixed electrode moving portion formed at a position away from an upper portion of the substrate by a predetermined distance;
   a spring portion operable to connect the fixed electrode fixing portion and the fixed electrode moving portion to each other so that the fixed electrode moving portion moves in a direction substantially perpendicular to a plate surface of the substrate;
   a movable electrode located away from the upper portion of the substrate by a predetermined distance to have a predetermined interval horizontal to the fixed electrode moving portion; and
   a cap wafer bonded to a predetermined area of one of the fixed electrode moving portion and the movable electrode by making each of the fixed electrode moving portion and the movable electrode have a vertical offset so that one of the fixed electrode moving portion and the movable electrode moves in a direction substantially perpendicular to the plate surface of the substrate.

8. An accelerometer manufactured comprising a vertical offset structure comprising:
   a substrate;
   a fixed electrode fixing portion formed on the substrate;
   a fixed electrode moving portion formed at a position away from an upper portion of the substrate by a predetermined distance;
   a spring portion operable to connect the fixed electrode fixing portion and the fixed electrode moving portion to each other so that the fixed electrode moving portion moves in a direction substantially perpendicular to a plate surface of the substrate;
   a movable electrode located away from the upper portion of the substrate by a predetermined distance to have a predetermined interval horizontal to the fixed electrode moving portion; and
   a cap wafer bonded to a predetermined area of one of the fixed electrode moving portion and the movable electrode by making each of the fixed electrode moving portion and the movable electrode have a vertical offset so that one of the fixed electrode moving portion and the movable electrode moves in a direction substantially perpendicular to the plate surface of the substrate.

9. An angular velocity system manufactured comprising a vertical offset structure comprising:
   a substrate;
   a fixed electrode fixing portion formed on the substrate;

a fixed electrode moving portion formed at a position away from an upper portion of the substrate by a predetermined distance;

a spring portion operable to connect the fixed electrode fixing portion and the fixed electrode moving portion to each other so that the fixed electrode moving portion moves in a direction substantially perpendicular to a plate surface of the substrate;

a movable electrode located away from the upper portion of the substrate by a predetermined distance to have a predetermined interval horizontal to the fixed electrode moving portion; and a cap wafer bonded to a predetermined area of one of the fixed electrode moving portion and the movable electrode by making each of the fixed electrode moving portion and the movable electrode have a vertical offset so that one of the fixed electrode moving portion and the movable electrode moves in a direction substantially perpendicular to the plate surface of the substrate.

10. A mirror manufactured comprising a vertical offset structure comprising:

a substrate;

a fixed electrode fixing portion formed on the substrate;

a fixed electrode moving portion formed at a position away from an upper portion of the substrate by a predetermined distance;

a spring portion operable to connect the fixed electrode fixing portion and the fixed electrode moving portion to each other so that the fixed electrode moving portion moves in a direction substantially perpendicular to a plate surface of the substrate;

a movable electrode located away from the upper portion of the substrate by a predetermined distance to have a predetermined interval horizontal to the fixed electrode moving portion; and a cap wafer bonded to a predetermined area of one of the fixed electrode moving portion and the movable electrode by making each of the fixed electrode moving portion and the movable electrode have a vertical offset so that one of the fixed electrode moving portion and the movable electrode moves in a direction substantially perpendicular to the plate surface of the substrate.

11. A method for manufacturing a vertical offset structure, the method comprising:

forming a fixed electrode fixing portion on a substrate;

forming a fixed electrode moving portion at a position away from an upper portion of the substrate by a predetermined distance;

forming a spring portion for connecting the fixed electrode fixing portion and the fixed electrode moving portion to each other so that the fixed electrode moving portion moves in a direction perpendicular to a plate surface of the substrate;

forming a movable electrode located away from the upper portion of the substrate by a predetermined distance to have a predetermined interval horizontal to the fixed electrode moving portion; and bonding a cap wafer to a predetermined area of one of the fixed electrode moving portion and the movable electrode by making each of the fixed electrode moving portion and the movable electrode to have a vertical offset so that one of the fixed electrode moving portion and the movable electrode moves in a direction substantially perpendicular to the plate surface of the substrate.

12. A method of manufacturing a vertical operation type capacitance electrode comprising a method for manufacturing a vertical offset structure comprising:

forming a fixed electrode fixing portion on a substrate;

forming a fixed electrode moving portion at a position away from an upper portion of the substrate by a predetermined distance;

forming a spring portion for connecting the fixed electrode fixing portion and the fixed electrode moving portion to each other so that the fixed electrode moving portion moves in a direction perpendicular to a plate surface of the substrate;

forming a movable electrode located away from the upper portion of the substrate by a predetermined distance to have a predetermined interval horizontal to the fixed electrode moving portion; and bonding a cap wafer to a predetermined area of one of the fixed electrode moving portion and the movable electrode by making each of the fixed electrode moving portion and the movable electrode to have a vertical offset so that one of the fixed electrode moving portion and the movable electrode moves in a direction substantially perpendicular to the plate surface of the substrate.

13. A method of manufacturing an accelerometer comprising a method for manufacturing a vertical offset structure comprising:

forming a fixed electrode fixing portion on a substrate;

forming a fixed electrode moving portion at a position away from an upper portion of the substrate by a predetermined distance;

forming a spring portion for connecting the fixed electrode fixing portion and the fixed electrode moving portion to each other so that the fixed electrode moving portion moves in a direction perpendicular to a plate surface of the substrate;

forming a movable electrode located away from the upper portion of the substrate by a predetermined distance to have a predetermined interval horizontal to the fixed electrode moving portion; and bonding a cap wafer to a predetermined area of one of the fixed electrode moving portion and the movable electrode by making each of the fixed electrode moving portion and the movable electrode to have a vertical offset so that one of the fixed electrode moving portion and the movable electrode moves in a direction substantially perpendicular to the plate surface of the substrate.

14. A method of manufacturing an angular velocity system comprising a method for manufacturing a vertical offset structure comprising:

forming a fixed electrode fixing portion on a substrate;

forming a fixed electrode moving portion at a position away from an upper portion of the substrate by a predetermined distance;

forming a spring portion for connecting the fixed electrode fixing portion and the fixed electrode moving portion to each other so that the fixed electrode moving portion moves in a direction perpendicular to a plate surface of the substrate;

forming a movable electrode located away from the upper portion of the substrate by a predetermined distance to have a predetermined interval horizontal to the fixed electrode moving portion; and bonding a cap wafer to a predetermined area of one of the fixed electrode moving portion and the movable electrode by making each of the fixed electrode moving portion and the movable electrode to have a vertical offset so that one of the fixed electrode moving portion and the movable electrode moves in a direction substantially perpendicular to the plate surface of the substrate.

15. A method of manufacturing a mirror comprising a method for manufacturing a vertical offset structure comprising:

forming a fixed electrode fixing portion on a substrate;

forming a fixed electrode moving portion at a position away from an upper portion of the substrate by a predetermined distance;

forming a spring portion for connecting the fixed electrode fixing portion and the fixed electrode moving portion to each other so that the fixed electrode moving portion moves in a direction perpendicular to a plate surface of the substrate;

forming a movable electrode located away from the upper portion of the substrate by a predetermined distance to have a predetermined interval horizontal to the fixed electrode moving portion; and bonding a cap wafer to a predetermined area of one of the fixed electrode moving portion and the movable electrode by making each of the fixed electrode moving portion and the movable electrode to have a vertical offset so that one of the fixed electrode moving portion and the movable electrode moves in a direction substantially perpendicular to the plate surface of the substrate.

* * * * *